(12) United States Patent
Robinson

(10) Patent No.: US 6,679,723 B1
(45) Date of Patent: Jan. 20, 2004

(54) ELECTRIC POWER WATTHOUR METER WITH COVER HANDLES

(75) Inventor: Darrell Robinson, Highland, MI (US)

(73) Assignee: Ekstrom Industries, Inc., Farmington Hills, MI (US)

( * ) Notice: Subject to any disclaimer, the term of this patent is extended or adjusted under 35 U.S.C. 154(b) by 0 days.

(21) Appl. No.: 09/990,904

(22) Filed: Nov. 14, 2001

(51) Int. Cl.$^7$ .............................................. H01R 13/00
(52) U.S. Cl. ...................... 439/483; 439/160; 324/156
(58) Field of Search .............................. 439/476.1, 483, 439/484, 160; 361/664–670; 29/578; D10/100, 103; 324/110, 156

(56) References Cited

U.S. PATENT DOCUMENTS

| | | | | |
|---|---|---|---|---|
| 2,468,351 A | * | 4/1949 | Vail | |
| 3,044,158 A | | 7/1962 | Bushnell | ...................... 29/278 |
| 3,120,639 A | * | 2/1964 | Pfeffer | |
| 3,133,247 A | * | 5/1964 | Sherman | ...................... 324/104 |
| 3,197,848 A | * | 8/1965 | Eichacker | |
| 3,322,380 A | | 5/1967 | Affel et al. | .................... 248/27 |
| 3,594,696 A | * | 7/1971 | Witek, Jr. | |
| 3,934,326 A | | 1/1976 | Owen et al. | ................... 29/278 |
| 4,019,135 A | * | 4/1977 | Lofdahl | ....................... 324/110 |
| 4,115,835 A | * | 9/1978 | Doby | ......................... 324/156 |
| 4,122,599 A | * | 10/1978 | Lunycz | ........................ 29/758 |
| 4,281,888 A | * | 8/1981 | Seaman | |
| 4,323,294 A | * | 4/1982 | Robinson | |
| 4,491,789 A | * | 1/1985 | Benbow | ....................... 324/156 |
| 4,907,334 A | * | 3/1990 | Carver | ......................... 29/278 |
| 5,097,581 A | | 3/1992 | Williams et al. | ............... 29/278 |
| 5,361,026 A | * | 11/1994 | Pruehs | ......................... 324/133 |
| 5,444,907 A | | 8/1995 | Becker | .......................... 29/764 |
| 5,503,271 A | * | 4/1996 | Lynch | ......................... 324/156 |
| 5,514,959 A | * | 5/1996 | Horan | ......................... 324/110 |
| 5,767,790 A | | 6/1998 | Jovellana | ............... 340/870.02 |
| 6,280,805 B1 | * | 8/2001 | Markovich | .................. 324/110 |
| 6,520,798 B1 | * | 2/2003 | Robinson | .................... 439/517 |

* cited by examiner

Primary Examiner—Neil Abrams
(74) Attorney, Agent, or Firm—Young & Basile, PC

(57) ABSTRACT

A cover adapted to be mounted on a watthour meter base includes a handle carried on the cover to facilitate movement of the watthour meter relative to a meter socket. The handle is generally provided as one or a pair of handles mounted on or unitarily formed with the body of the cover, the handle defining a finger grip surface. In one aspect, the handle is a pair of arms extending from the cover, with a cross piece mounted to and extending between the arms. In another aspect, an ejector handle is moveably mounted with respect to a primary handle carried on the end wall of the cover. Ejector arms coupled to the ejector handle and moveably disposed through the cover and meter base have distal ends engagable with meter mounts in the meter socket to facilitate separation of the meter from the socket upon movement of the ejector handle.

54 Claims, 7 Drawing Sheets

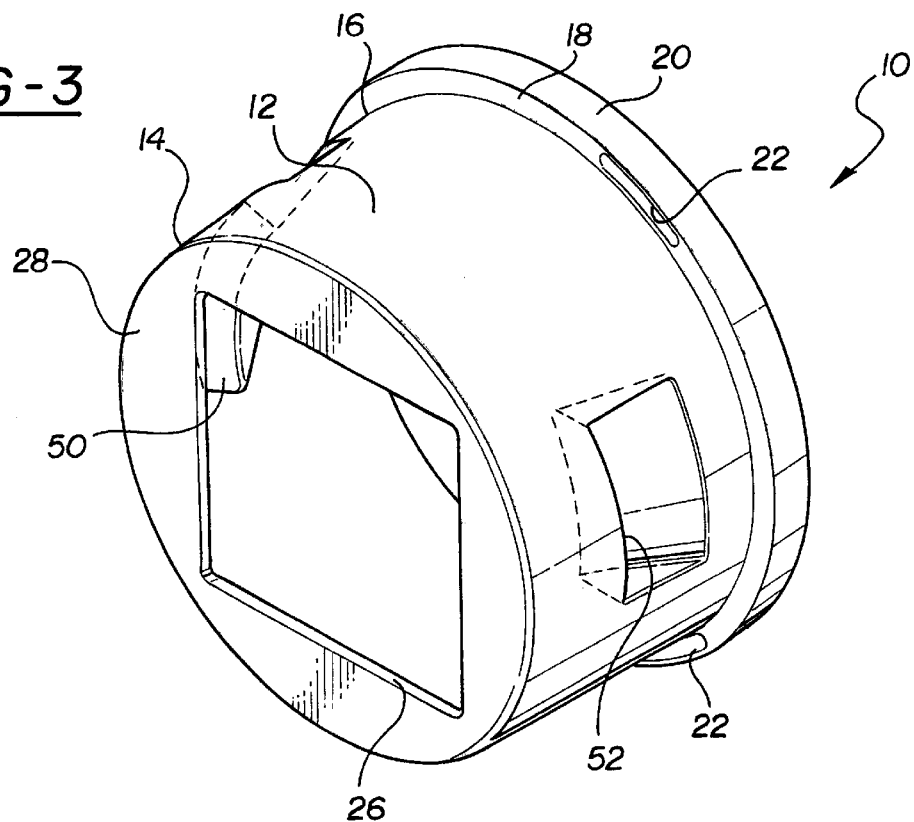
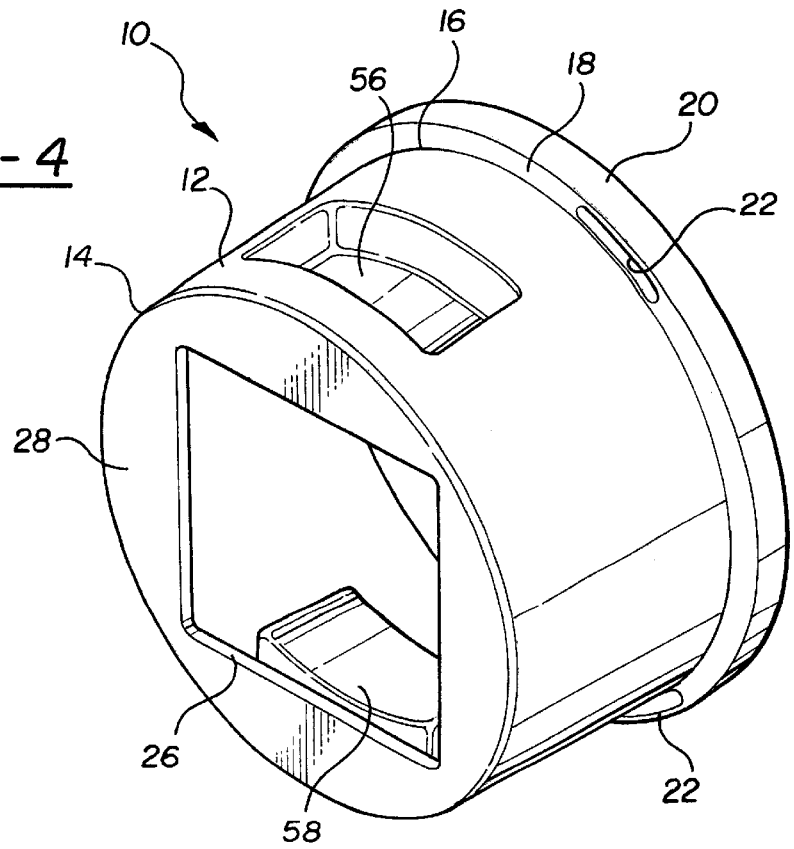

ELECTRIC POWER WATTHOUR METER WITH COVER HANDLES

BACKGROUND

Electrical power is supplied by an electric utility to individual use sites by power line conductors which extend from the utility poles to a meter socket mounted on a convenient surface at the use site. The power line conductors are physically connected to line jaw contacts in the meter socket. Distribution conductors extend from load jaws mounted in the socket throughout the use site.

An electric power watthour meter is provided for measuring the power consumed by a use site by measuring the current drawn by the use site from the line to the load conductors. A watthour meter typically has a base on which metering components are mounted. Blade terminals extend from the base for interconnection in the socket line and load jaw contacts so as to place the meter in series between the power line conductors and the power load conductors. A dome historically formed of glass surrounds the electromechanical components mounted on the watthour meter base. The dome includes a mounting flange having slots which engage mating projections on the base so as to lock the dome to the base when the dome is rotated 10° after connection to the base. A seal or key is used to then lock the dome to the base.

With the advent of electronic meters and automatic meter reading equipment, the glass dome has been replaced with a plastic dome or cover typically having a view window in an end wall for viewing an electronic display of power consumption. The plastic domes are still formed with a mounting flange with slots for engagement with a standard meter base carrying the blade terminals and metering components.

The watthour meter is installed in the socket and/or a socket adapter or socket extender mounted in the socket which also carries mating jaw contacts by inserting the meter blade terminals into the meter socket or socket adapter jaw contacts.

Although watthour meters typically remain in place for many years without removal, it still becomes necessary from time to time to remove the meter for accurately testing, repair, replacement or to add additional functionality to the meter socket or watthour meter itself The smooth, tapered, cylindrical shape of the watthour meter dome or cover makes it difficult to pull the meter from the socket. The dome itself would be a convenient place for a utility service person to grasp the meter and exert a pull-out force as the utility person would like to keep his or her fingers away from the meter mounting base which is generally in close proximity to the live power conductors and jaw contacts in the meter socket. However, heretofore there has been no convenient surface on a watthour meter dome for easy grasping by the utility service person to facilitate removal with low pull-out forces. Thus, it would be desirable to provide a watthour meter which is designed to facilitate easy removal from a meter socket or socket adapter.

When a watthour meter is installed in a meter socket or meter socket adapter mounted in a meter socket, it is critical that the meter line blades be properly oriented for insertion into the meter socket or meter socket adapter line jaw contacts. However, existing watthour meter domes have a round shape which lacks any external visual or tactile indication of a top point or portion of the meter which would insure that the line blades are properly orientated for engagement with the line jaw contacts in the meter socket or meter socket adapter. Without such visual or tactile indication, it is possible for the utility serviceperson to inadvertently insert the meter 90° out of normal mounting orientation into the meter socket. This places the one line blade terminal and one load blade terminal of the watthour meter in a direct short position across the meter socket or meter socket adapter line jaw contacts. Such an electrical fault can cause injury to the utility serviceperson and/or damage to the meter socket as a result of a typically explosive short circuit at full line power.

It is also possible for the utility serviceperson to insert the meter 180° out of normal mounting orientation into the meter socket or socket adapter. This places the meter in a mounting condition which causes the meter to run backwards thereby subtracting power. Indeed, this is common method of stealing electric power.

These mounting problems are exacerbated in the case of electronic meters which still have a round cross section; but are usually formed with an opaque cover which thereby eliminates any possibility of viewing the internal meter components to determine the proper orientation of the meter for installation in a meter socket or socket adapter. Even the display in such electronic meters is off or blank until the meter is installed in the socket such that the display cannot any visual indication of proper meter mounting orientation during installation.

Thus, it would be desirable to provide a watthour meter having a cover which is capable of indicating the proper mounting orientation of the watthour meter in a meter socket or meter socket adapter. It would also be desirable to provide such a proper mounting orientation indication which can be provided by a handle carried on the cover which also functions to facilitate easy removal of the watthour meter from the meter socket or socket adapter. It would also be desirable to provide a watthour meter cover which is capable of providing a standardized handle position which not only facilitates easy removal; but also provides a visual as well as tactile indication of the proper mounting orientation of the watthour meter for safe insertion into a meter socket or socket adapter.

SUMMARY

The present invention is a cover for a watthour meter which has a handle carried on the cover to facilitate low pull-out force removal of the watthour meter from a meter socket or meter socket adapter.

In one aspect, the handle comprises a one piece member unitarily formed with the cover. In another aspect, the cover and handle are molded as a one piece unit.

The handle includes at least one arm extending from a body of the cover with a grip member connected to the at least one arm. Alternately, the handle comprises two arms extending from the body, with a cross member fixed between the two arms.

In one aspect, the handle is in the form of an integral extension of the body or a sidewall of the cover. An end lip is disposed at an angle to one end of the extension or arm and defines an inner finger grip surface.

In another aspect, the handle includes at least one or a pair of circumferentially spaced recesses formed in the body, each recess defining a finger grip surface.

In yet another aspect, the handle includes at least one or a pair of circumferentially spaced projections extending outward from the body of the cover, each projection defining a finger grip surface.

In yet another aspect, the handle comprises a U-shaped member having a central leg with side legs extending from opposite ends. The side legs are fixedly joined to the body to space the central leg from the body. This handle is also removable from the cover.

In yet another aspect, an ejector handle is mounted about the first or primary handle. At least one, or a pair of ejector arms are connected to the ejector handle and extend through the body of the cover to distal ends adapted to be disposed exteriorly of a base of a watthour meter to which the cover is mounted. The distal ends of each ejector arm are adapted to be moveable with respect to the base of the watthour meter upon movement of the ejector handle from a first to a second position. The distal ends of the ejector arms are thus forcibly urged against a mating surface, such as a watthour meter mount in a meter socket or the mounting rim on a ring style socket cover or socket adapter to begin the separation of the meter base blade terminals from the socket or socket adapter jaw contacts.

The present invention also contemplates a watthour meter having a cover with unique handles as described above.

The watthour meter with unique cover handles of the present invention provides significant advantages in terms of facilitating easy removal and, optionally, installation of a watthour meter, into or out of a watthour meter socket or socket adapter mounted in a watthour meter socket. The handles provide a convenient gripping surface for easy pull-out to separate the meter from the meter socket or socket adapter. At the same time, the handles do not interfere with the normal function of the cover or viewing of power consumption readout displays through the end wall of the cover.

The handles are provided in different aspects, several of which are unitarily formed as a one piece assembly with the cover, such as during molding of the cover, or removably attached to the cover by fasteners to provide the handle function without a significant increase in the manufacturing cost of the cover.

In one unique aspect, the ejector handle moves a pair of ejector arms which extend through the cover and the meter base and engage meter mounting surfaces, such as the mounting ring of a ring style socket cover or the mounting flanges within a ringless style socket, to facilitate easy separation of the meter blades from the meter jaw contacts.

The watthour meter with cover handles according to the present invention addresses a long time problem encountered with the prior use of watthour meters which lack a convenient surface to facilitate easy, pull-out from a meter socket or meter socket adapter. According to the present invention, the handles or gripping surfaces carried on the meter cover enable a utility serviceperson to easily grasp the cover handles and exert a smooth pull-out force to separate the meter from the socket or socket adapter jaw contacts.

The cover handles of the present invention may also be used to increase the installation safety of a watthour meter in a meter socket or socket adapter since the handles, when mounted at a position to indicate the normal mounting orientation of the watthour meter in a meter socket insure that the watthour meter line and load blade terminals are properly aligned with the corresponding line and load jaw contacts in the meter socket or socket adapter. Specifically, the mounting of the handle of the present invention at a position on the cover which would indicate visually as well as tactally the normal top of the watthour meter when the watthour meter is in its normal mounting orientation with respect to the meter socket jaw contacts, can provide a standardized indication of proper meter orientation prior to installation in the meter socket or socket adapter. This increases installation safety by minimizing the possibility of a 90° our of orientation mounting of the watthour meter in the meter socket which can cause a dangerous electric fault. This also minimizes the possibility of mounting the watthour meter 180° out of normal mounting orientation in a meter socket which is the common method used to steal unmetered electric power.

BRIEF DESCRIPTION OF THE DRAWING

The various features, advantages and other uses of the present invention will become more apparent by referring to the following detailed description and drawing in which:

FIG. 3 is a perspective view of yet another aspect of a watthour meter cover according to the present invention;

FIG. 4 is a perspective view of yet another aspect of a watthour meter cover according to the present invention;

DETAILED DESCRIPTION

Figure 1:
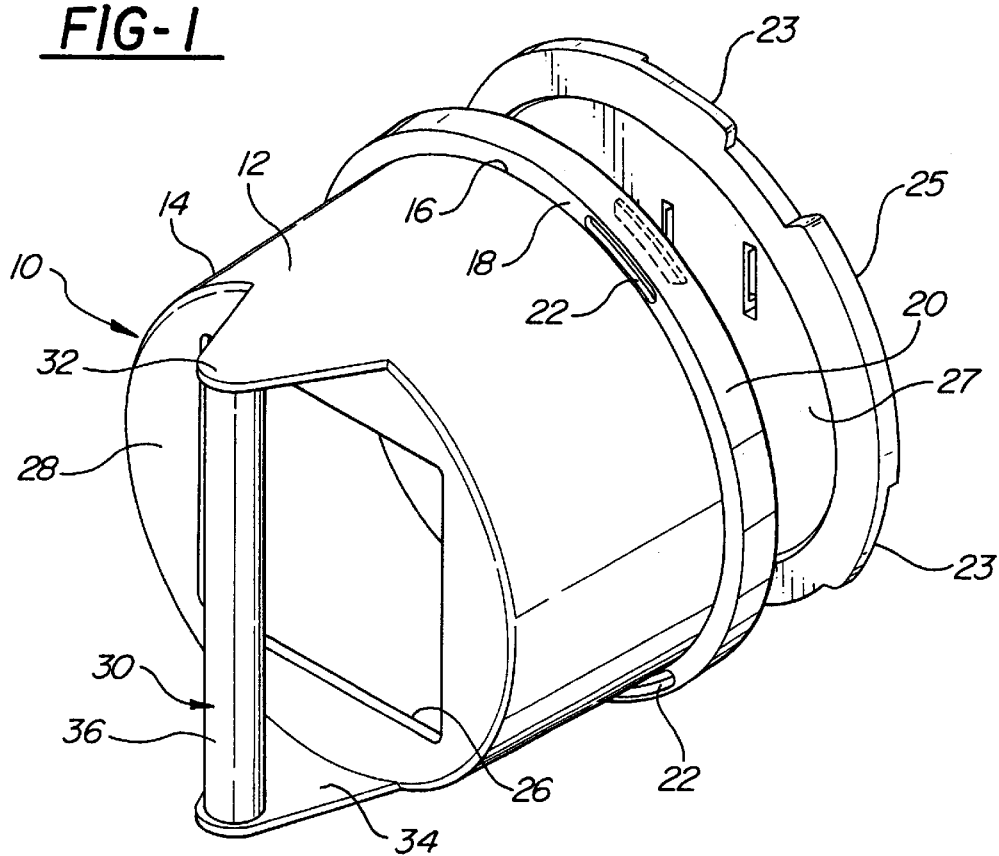
FIG. 1 is a perspective view of a watthour meter cover constructed in accordance with one aspect of the present invention.

Referring now to the drawings, there is depicted a watthour meter cover or dome which has unique handle means to facilitate the removal of the watthour meter from engagement or mounting in a meter socket.

As shown in FIG. 1, the meter cover or dome, both hereafter refer to simply as the "cover", is typically formed of a one piece body 10 of a suitable material, preferably a plastic, such as polycarbonate, for example. The cover 10 includes a generally cylindrical sidewall 12 which tapers from a first, smaller diameter end 14 to an opposed larger diameter second end 16. A radially extending flange 18 projects from the second end 16 of the sidewall 12 and terminates in a longitudinally extending rim 20.

As is conventional, a plurality of circumferentially spaced slots 22 are formed in the flange 18 for engagement with mounting projections 23 on a watthour meter base 25. As is conventional, the rim 20 and flange 18 of the cover 10 are inserted over the base 25 with the slots 22 aligned with the meter base projections 23.

The meter cover 10 is then rotated 90° to lock the cover 10 to the base 25. A key, not shown, is typically inserted through the cover 10 into the base 25 to lock the cover 10 to the base 25.

The use of the rim 20 and flange 18 on the cover which are rotated into engagement with the base of a meter is by way of example only. As shown pictorially in FIG. 1, the watthour meter includes a base 25 having projections 23 spaced circumferentially around one surface for rotational engagement with the slots 22 on the cover 10. Also shown pictorially in FIG. 1 are metering components 27 which may take any suitable metering form, such as electromechanical rotating disk-type metering components as well as electronic metering circuits.

Other means for attaching the cover 10 to the base 25 may also be employed. Such means may not make use of the rotationally interconnected projections 23 and slots 22, but rather use other types of fastening means to secure the cover 10 to the base 25. Such alternate attachment configurations may also not require the flange 18 on one end of the cover 10.

As shown in FIG. 1, an optional aperture 26 is formed in a solid end wall 28 at the first end 14 of the cover 10. The aperture 26 which is typically closed by a display mounted on the meter base allows external viewing of the power consumption numeric outputs on the display as is conventional in electronic or automatic meter reading watthour meters. Alternately, the optional aperture 26 can be replaced by forming at least the end wall 28 or the entire cover 10 from a transparent plastic.

By way of further background, the assembled watthour meter, including the cover 10 and the base, are mounted in engagement with jaw contacts in a watthour meter socket or a watthour meter socket extender or socket adapter mounted in a meter socket. Blade terminals, not shown in FIG. 1, project exteriorly from an exterior surface of the base into engagement with the jaw contacts in the socket adapter and/or socket so as to place the watthour meter in series with the utility power line conductors and the distribution load conductors, each connected to the socket jaw contacts.

Since accurate power consumption measurement requires a secure electrical connection between the watthour meter blade terminals and the socket jaws, the socket jaws and/or the socket adapter jaws,are typically formed to have a high blade terminal retention force. This retention force, translates to a high watthour meter pull-out force.

In order to facilitate the removal of the watthour meter from a socket and/or watthour meter socket adapter, the present invention provides a unique handle means carried on the cover 10.

A first aspect of the handle means is shown in FIG. 1. As depicted therein, the handle means denoted by reference number 30 includes at least one and, preferably a pair of arms 32 and 34 which are unitarily mounted to or, optionally, integrally molded with the cover 10. The arms 32 and 34 project longitudinally from the first end 14 of the cover 10 away from the first end wall 28. A rod 36 is joined to or integrally formed with the outer ends of the arms 32 and 34 to form a unitary part of the arms 32 and 34. Thus, the rod 36 which is depicted in the form of a cylinder, may be integrally formed with the arms 32 and 34 and the cover 10 at the time of molding of the cover 10. Alternately, the rod 36 may be a separate member which is secure to the arms 32 and 34 by means of fasteners extending through the arms 32 and 34 into opposite ends of the rod 36. The rod 36 may also be securely joined to the arms 32 and 34 by other means, such as heat welding, etc.

As shown in FIG. 1, the rod 36 is centrally positioned over the end wall 28. This location will not interfere to any great extent with the ability to read out the power consumption display of the watthour meter contained within the cover 10. At the same time, the central location of the handle means 30 provides a centralized application of pull-out force to maximize the pull-out force required to be exerted by a utility person upon removing the watthour meter from a socket or socket adapter.

Figure 2:
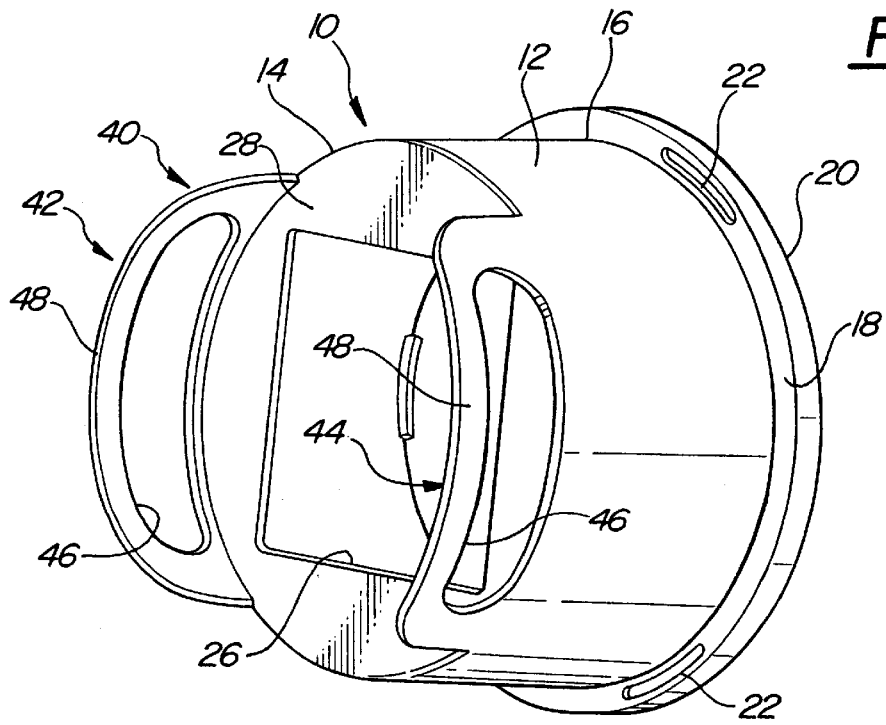
FIG. 2 is a perspective view of another aspect of a watthour meter cover according to the present invention.

Another aspect of the handle means of the present invention is shown in FIG. 2. For consistency, throughout the following description of various aspects of the handle means, the cover 10 will be depicted in essentially the same form and with the same element reference numbers as described above and shown in FIG. 1. Only the modifications to the basic configuration of the cover 10 will be described in detail and provided with a separate reference number.

In the aspect of the invention shown in FIG. 2, the handle means 40 is in the form of at least one and, preferably, a pair of arms 42 and 44 projecting from the first end 14 of the sidewall 12 away from the end wall 28. The arms 42 and 44 are preferably diametrically opposed, and be provided at any angular orientation about the periphery of the end wall 28. Further, the arms 42 and 44 do not have to be diametrically opposed, but can be provided at any other circumferential spacing.

Each arm 42 and 44 is joined at the first end 14 of the sidewall 12. Although each arm 42 and 44 can be formed as a separate member and unitarily joined to the cover 10 by welding, mechanical fasteners, adhesive, etc., the arms 42 and 44 are preferably molded as a unitary part of the cover 10 at the time of molding of the cover 10.

Due to the circular shape of the end wall 28, each arm 42 and 44 has a generally arcuate shape between opposed ends. An elongated, slot-like aperture 46 is formed in each arm 42 and 44. The aperture 46 forms an outer leg 48 on each arm 42 and 44 which acts as a finger grip for the utility serviceperson to wrap his or her fingers around when removing the watthour meter from the socket or socket adapter.

Referring now to FIG. 3, another aspect of the handle means is depicted in the form of at least one and preferably a pair of radially inward extending depressions or recesses 50 and 52 which are unitarily formed or molded in the sidewall 12. Each depression recess 52 and 54 may have any shape, such as the elongated slot-like shape shown in FIG. 3. One inner sidewall of each recess 52 and 54 acts as a finger grip surface to facilitate removal of the watthour meter from the socket or socket adapter.

As in prior aspects of the handle, the recesses 50 and 52, although shown as being diametrically opposed, from each other along the lateral centerline of the cover 10, the recesses 50 and 52, may be at any other angular position about sidewall 12 and at any other, non-diametrical spacing.

FIG. 4 depicts a modification to the handle shown in FIG. 3. In this aspect, the handle means is also in the form of recesses or depressions 56 and 58 formed in the sidewall 12 generally at twelve o'clock and six o'clock positions. The recesses 56 and 58 are shown as having a generally square or polygonal cubic configuration; although other shapes are also possible.

Figure 5:
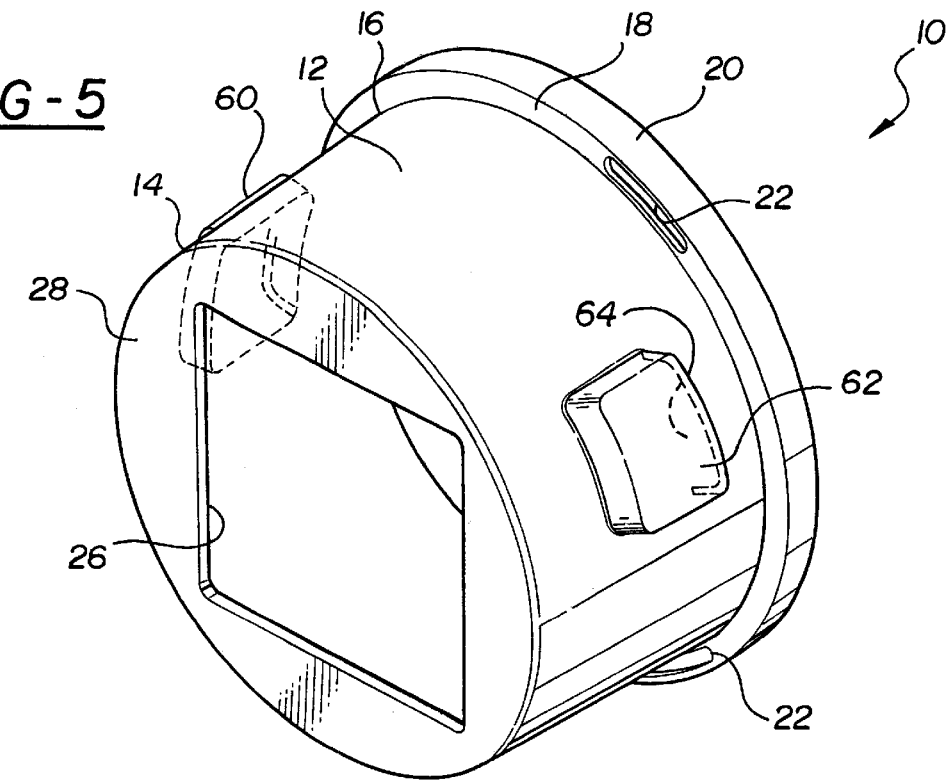
FIG. 5 is a perspective view of yet another aspect of a watthour meter cover according to the present invention.

In FIG. 5, the handle means is depicted in the form of at least one, and preferably, a pair of handles 60 and 62 which are located at diametrically opposed positions on the sidewall 12 and extend radially outward from the exterior surface of the sidewall 12. Each handle 60 and 62 may be in the form of a solid hollow member, with an interiorly extending, concave recess 64 optionally formed on a side surface, facing the flange 18 to form a convenient finger grip surface to facilitate removal of the watthour meter as described above.

Figure 6:
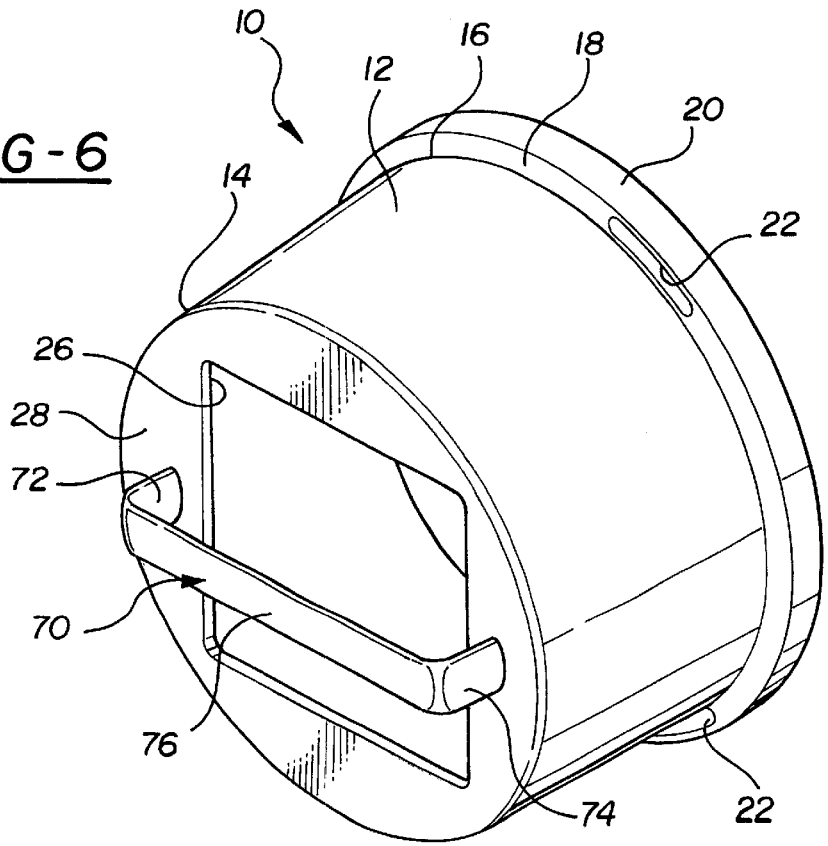
FIG. 6 is a perspective view of yet another aspect of a watthour meter cover according to the present invention.
Figure 7:
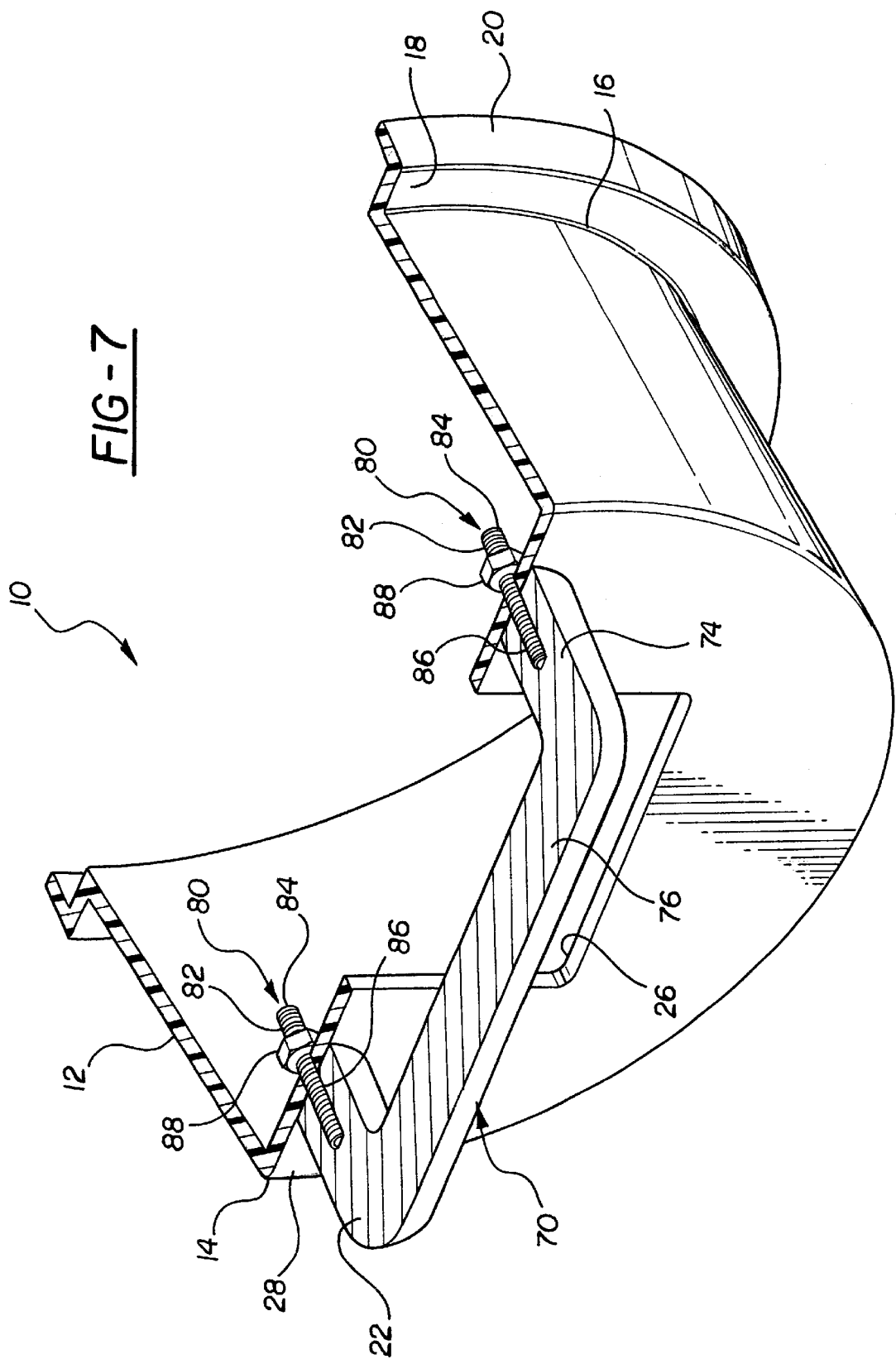
FIG. 7 is a partially broken, view of the watthour meter cover shown in FIG. 6.

Referring now to FIGS. 6 and 7, in this aspect of the invention, the handle means 70, hereafter referred to as a primary handle 70, is mounted on the end wall 28 of the cover 10. The handle 70 includes a pair of spaced side legs 72 and 74 which are integrally joined at one end by a central end leg 76. The side legs 72 and 74 space the central leg 76 away from the end wall 28 of the cover 10.

Although the handle 70 is depicted as being positioned along a lateral centerline of the end wall 28, the handle 70 may also be mounted at other positions, particularly if a certain portion of the display viewable through the aperture 26 needs to be more easily viewed. However, the mounting of the handle 70 are on any angular orientation on the end wall 28 still facilitates a smooth, centralized pull-out force to remove the watthour meter, on which the cover 10 is mounted, from the meter socket or meter socket adapter. The service utility person need only wrap his or her fingers about the central end leg 76 in the space between an inner edge of the central leg 76 and the end wall 28.

Although the handle 70 can be removably mounted to the end wall 28 in any of a number of different ways, including welding, adhesives, etc., in one aspect, a pair of fasteners, each denoted by reference number 80, include an elongated shank 82 having oppositely threaded ends 84 and 86. The threaded ends 84 project interiorly through the end wall 28 into the interior of the cover 10 and receive a nut 88. The opposite ends 86 project exteriorly of the end wall 28 into a threaded bore formed in the side legs 72 and 74 of the handle 70 to securely affix the handle 70 to the end wall 28 of the cover 10. Since the fasteners 80 are accessible only from the interior of the cover 10 which is normally locked to the base 25, the cover is secure since the handle 70 cannot be easily removed from the exterior of the cover 10 to gain access to the meter housed in the cover 10.

Alternately, the handle 70 can be integrally molded to the end wall 28 of the cover 10.

Figure 8:
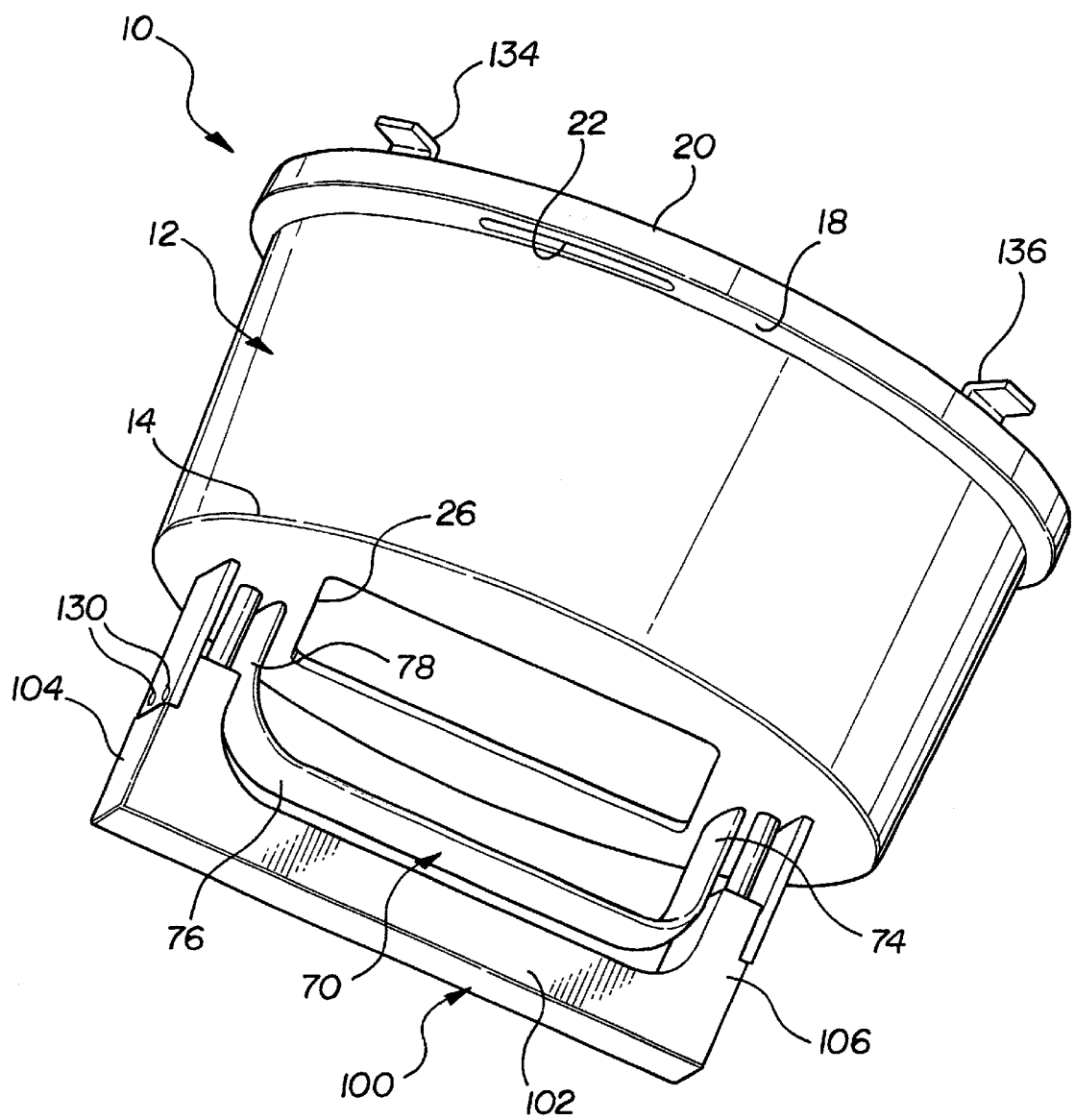
FIG. 8 is a perspective view of yet another aspect of a watthour meter cover according to the present invention.
Figure 9:
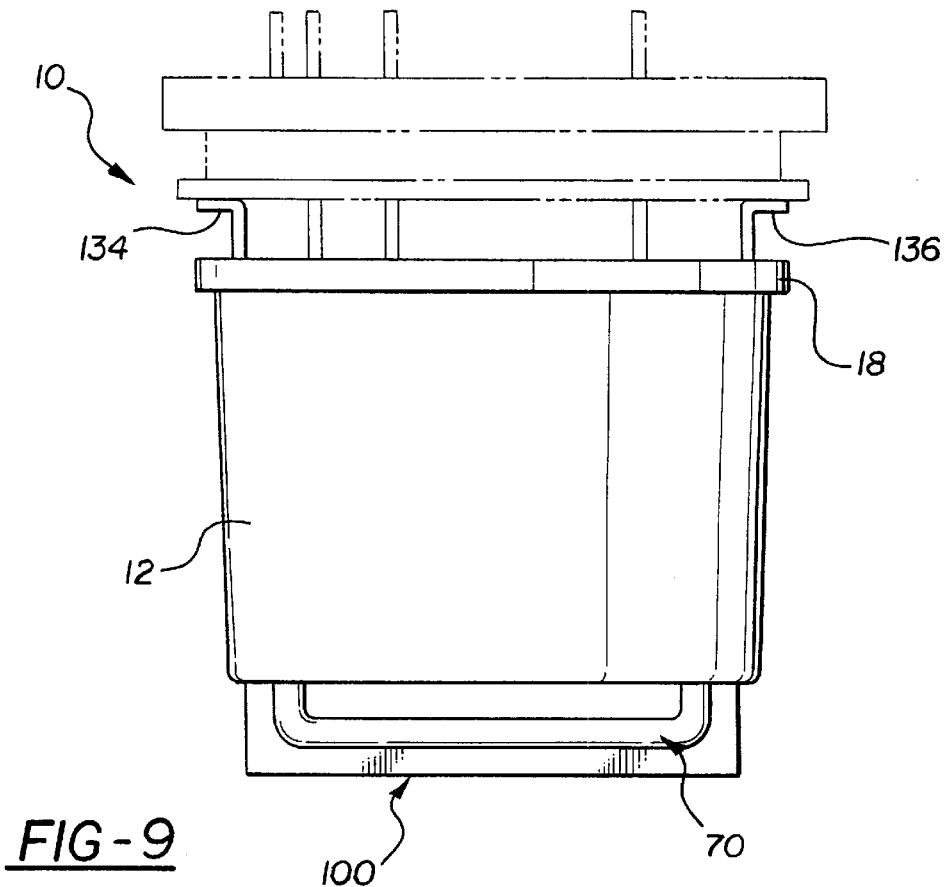
FIG. 9 is a side elevational view of the watthour meter cover shown in FIG. 8.
Figure 10:
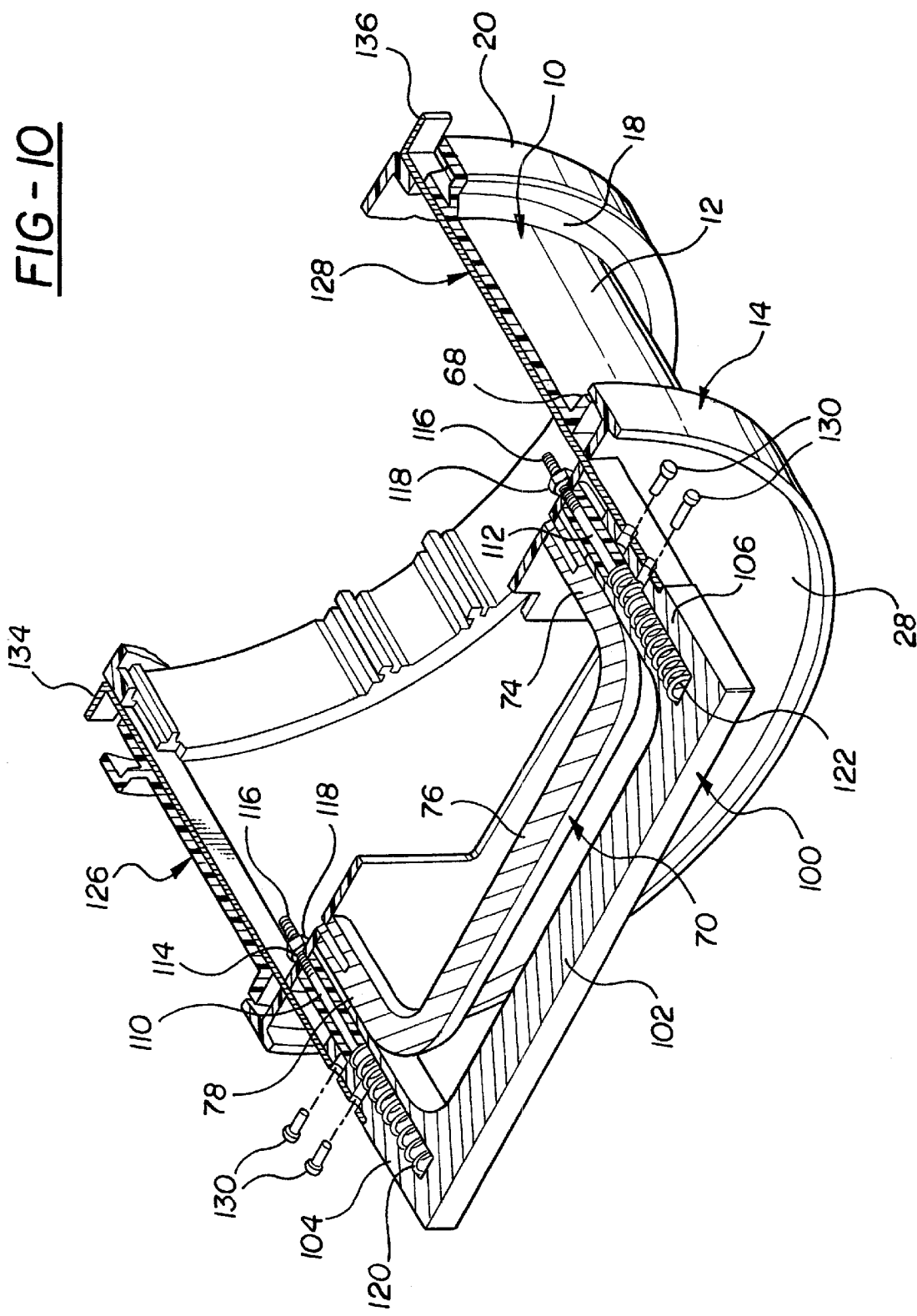
FIG. 10 is a partially broken away, cross-sectional view of the watthour meter cover shown in FIGS. 8 and 9.

As shown in FIGS. 8–10, for example, an ejector handle 100 is formed with a central leg 102 which is connected at opposite ends to a pair of spaced, side legs 104 and 106. The central leg 102 has a length slightly longer than the overall length of the central leg 76 and the two side legs 72 and 74 of the primary handle 70, to enable the side legs 104 and 106 of the ejector handle 100 to be disposed adjacent to and laterally or radially outward from the side legs 72 and 74, respectively, of the primary handle 70.

A pair of stand-offs 110 and 112 of generally tubular form are provided to extend from the end wall 28 of the cover 10. Each stand-off 110 and 112 includes a central threaded bore 114 which receives a fastener 116 to mount each stand-off 114 and 116 on the end wall 28 of the cover 10. A lock nut 118 may be provided on each fastener 118 to lock the stand-offs 114 and 116 in position.

The upper end of each stand-off 114 and 116 forms a seat for a coil spring 120 and 122, respectively, which are disposed in hollow bores in each of the side legs 104 and 106 of the ejector handle 100. The springs 120 and 122 normally biased the side legs 104 and 106 and the central leg 102 of the ejector handle 100 outward from the end wall 28 to a normal, inoperative position shown in FIG. 10.

At least one, and, preferably, a pair of ejector arms 126 and 128 extend through aligned apertures in the end wall 28 of the cover 10 in the base of the watthour meter, not shown. One end of each ejector arm 126 and 128 is secured by means of fasteners, such as rivets 130, to a side portion of the ejector handle side legs 104 and 106, respectively.

The distal ends 134 and 136 of each ejector arm 126 and 128, respectively, are disposed at an angle, such as perpendicular, to the remainder of each ejector arm 126 and 128 to act as surfaces which are disposed exteriorly adjacent to the outer mounting edge or flange of the watthour meter base, as shown in FIG. 9.

When it is desired to separate the watthour meter from the socket or socket adapter, the utility service person merely has to wrap his or her hand around the central leg 102 of the ejector handle 100 and the central leg 76 of the primary handle 70 and squeeze the two central legs 102 and 76 together until the central leg 102 of the ejector handle 100 abuts the central leg 76 of the primary handle 70, as shown in FIG. 9. This corresponds to the watthour meter eject position.

Movement of the ejector handle 100 toward the primary handle 70 causes the ejector arms 126 and 128 to slide through the enlarged apertures in the watthour meter base to thereby force the distal ends or flanges 134 and 136 against the underlying mounting flange on a ring style socket cover to which the watthour meter is mounted thereby urging the watthour meter base away from the socket cover rim to pull the jaw out of the blade terminals extending outward from the watthour meter base away from the jaw contacts in the socket. Even if the base of the watthour meter is not completely separated from the socket adapter cover at full extension of the ejector arms 126 and 128, a sufficient length of the blade terminals of the watthour meter will have been separated from the corresponding jaw contacts in the socket adapter or meter socket to enable only a small additional force to be needed to completely separate the watthour meter from the socket adapter or socket.

Figure 11:
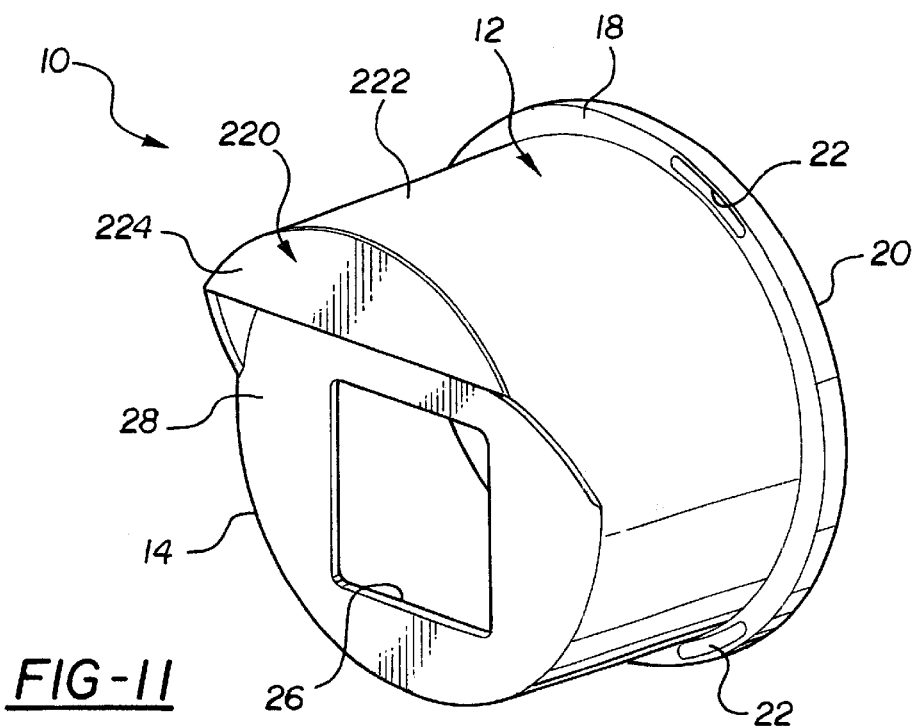
FIG. 11 is a perspective view of another aspect of a watthour meter cover according to the present invention.

Another aspect of the cover 10 of the present invention is shown in FIG. 11. In this aspect, the handle 220 is formed as an integral one piece extension of the body of the cover 10, such as an extension or arm 222 of the sidewall 12 of the body of the cover 10. The extension 222 extends over a predetermined angular extent of the sidewall 12 and projects a short distance away from the end wall 28 of the cover 10. An end flange or end lip 224 is integrally formed on the end of the extension 222 at an angle, such as perpendicular, by way of example only, from the end of the extension 222. The end lip 224 overlays and is spaced from the end wall 28. An inner surface of the end lip 224 defines a finger grip surface to facilitate removal of the cover 10 from a watthour meter socket adapter or watthour meter socket. Preferably, the extension 222 and the sidewall 12 are formed as an integral, one piece member during the molding process used to form the cover 10.

The extension or arm 222 and the end lip 224 act as a visor or sun shade which is useful in shading the watthour meter display visible through the window 26 in the end wall 28. This visor function also protects the end wall 22 and the display window 26 from becoming covered with dirt, dried rain, etc.

The sidewall extension 222, when located along the top portion of the cover 10 when the cover 10 is in its normal mounting position on a watthour meter also can be used as an indication of the top of the watthour meter. This assures that the watthour meter is correctly in-stalled with the line blades inserted into the line jaw contacts in the socket or socket adapter. This prevents an inadvertent mounting of the watthour meter 90° out of normal mounting orientation which places one line and one load blade in a direct short across the meter or meter socket adapter line jaw contacts or 180° out of normal mounting orientation which would cause the meter to run backwards.

It is also possible within the scope of the present invention to replace the extension or arm 222 and the end lip 224 with a recess through the end wall 22 of the cover. The outer edge of the recess, which can be located at any angular position on the end wall 22, but preferably at the top to indicate the normal mounting orientation of the meter in a meter socket or socket adapter, can be formed with an edge or lip to act as a finger grip surface to facilitate movement of the entire watthour meter with respect to the meter socket or socket adapter.

Optionally, the extension or arm 222 and end lip 224 could be positioned along the bottom edge of the end wall 28 when the cover 10 is in its normal mounting position on a watthour meter base. A drain hole may be needed in this orientation to allow any rainwater collected in the cup-shaped extension and lip to drain away from the sidewall extension.

The various aspects of the handle means of the present invention show that the handle, in the various aspects, is carried on the cover and is mounted on the cover to facility low force-pullout or separation of a watthour meter from a meter socket or meter socket adapter. The handle is permanently and non-removably formed as a unitary, single part of the cover in several aspects or is removably attached to the cover by fasteners. It will be understood that certain aspects of the handle, such as the handle means 40 shown in FIG. 2, the handle means 70 shown in FIG. 6, or the handle means 220 shown in FIG. 11 may also be formed as a separate part, discrete from the cover and removably attached to the cover only when it is desired to remove the watthour meter from the meter socket or a meter socket adapter. Each of such handle means can be provided with simple hooks or snap-on attachments which engage suitable mating bosses or projections or other receiver members carried on the cover to facilitate the removable attachment of the handle means to the cover.

In summary, there has been disclosed a watthour meter cover having unique handles which facilitate removal of the watthour meter from a watthour meter socket or socket adapter/extender. The handles are carried on the watthour meter cover, preferably by integral molding with the cover, and are conveniently located to facilitate a smooth, easy pull-out motion with the lowest possible pull-out force to separate the watthour meter from the socket adapter or meter socket. At the same time, the handles do not interfere with the normal operation of the watthour meter or viewing of the power consumption readout display through the end wall of the cover.

In a specific unique arrangement, an ejector handle is mounted on the watthour meter cover to facilitate separation of the watthour meter blade terminals from the socket or socket adapter jaw contacts. This reduces the overall pull-out force required to completely separate the watthour meter from the socket or socket adapter.

What is claimed is:

1. A watthour meter comprising:
a base with electric power metering components;
a cover attachable to the base to enclose the metering components; and
a handle carried on the cover and formed primarily to facilitate movement of the watthour meter with respect to a mounting connection with a watthour meter socket, at least a portion of the handle formed as a monolithic part of the cover.

2. The improvement of claim 1 wherein the handle comprises a one piece member unitary with the cover.

3. The improvement of claim 1 wherein the cover and the handle are molded as a one piece unit.

4. In a watthour meter having a base with metering components and a cover attachable to the base to enclose the metering components, an improvement in the cover comprising:
a handle carried on the cover and formed primarily to facilitate movement of the watthour meter with respect to a mounting connection with a watthour meter socket;
the handle including two diametrically opposed arms extending perpendicularly from the cover, each arm having an aperture therein forming a gripping surface.

5. In a watthour meter having a base with metering components and a cover attachable to the base to enclose the metering components, an improvement in the cover comprising:
a handle carried on the cover and formed primarily to facilitate movement of the watthour meter with respect to a mounting connection with a watthour meter socket; the handle including at least one recess formed in the cover defining a finger grip surface.

6. The improvement of claim 5 wherein the at least one recess comprises:
two circumferentially spaced recesses formed in the body, each defining a finger grip surface.

7. In a watthour meter having a base with metering components and a cover attachable to the base to enclose the metering components, an improvement in the cover comprising:
a body having a sidewall extending between first and second ends, a mounting flange formed at the first end of the sidewall, an end wall formed at the second end of the cover; and
a handle carried on the body and formed primarily to facilitate movement of the watthour meter with respect to a mounting connection with a watthour meter socket, at least a portion of the handle formed as a monolithic part of the body.

8. In a watthour meter having a base with metering components and a cover attachable to the base to enclose the metering components, the improvement to the cover comprising:
a handle unitarily carried on the cover and defining a grip surface and formed primarily to facilitate movement of the watthour meter with respect to a mounting connection with a watthour meter socket, at least a portion of the handle formed as a monolithic part of the cover.

9. In a watthour meter having a base with metering components and a cover attachable to the base to enclose the metering components, the improvement to the cover comprising:
a body; and
a handle unitarily carried on the body and formed primarily to facilitate movement of the watthour meter with respect to a mounting connection with a watthour meter socket, the handle including a pair of arms extending from the body, a cross bar extending between the arms and spaced from the body, and at least a portion of the handle formed as a monolithic part of the body.

10. In a watthour meter having a base with metering components and a cover attachable to the base to enclose the metering components, the improvement in the cover comprising:
a body; and
a handle carried on the body and formed primarily to facilitate movement of the watthour meter with respect to a mounting connection with a watthour meter socket, the handle including a pair of arms extending from the body, each arm having an aperture defining a finger grip surface on the arm.

11. In a watthour meter having a base with metering components and a cover attachable to the base to enclose the metering components, the improvement in the cover comprising:

a body;

a handle carried on the body and formed primarily to facilitate movement of the watthour meter with respect to a mounting connection with a watthour meter socket, the handle including at least one projection extending outward from the body and defining a finger grip surface, at least a portion of the handle formed as a monolithic part of the cover.

12. In a watthour meter having a base with metering components and a cover attachable to the base to enclose the metering components, the improvement in the cover comprising:

a body; and a handle carried on the body and formed primarily to facilitate movement of the watthour meter with respect to a mounting connection with a watthour meter socket, the handle including at least one recess formed in the body, the recess defining a finger grip surface.

13. In a watthour meter having a base with metering components and a cover attachable to the base to enclose the metering components, the improvement in the cover comprising:

a body;

a handle carried on the body and formed primarily to facilitate movement of the watthour meter with respect to a mounting connection with a watthour meter socket, the handle comprising a U-shaped member fixedly secured to the body, at least a portion of the handle formed as a monolithic part of the body.

14. In a watthour meter having a base with metering components and a cover attachable to the base to enclose the metering components, the improvement in the cover comprising:

a body; and a handle carried on the body and formed primarily to facilitate movement of the watthour meter with respect to a mounting connection with a watthour meter socket, the handle including a unitary extension of the body, an end lip carried on one end of the handle and defining a finger grip surface.

15. In a watthour meter, the improvement comprising:

a base carrying metering components;

a cover mounted on the base; and a handle carried on the cover and formed primarily to facilitate movement of the watthour meter with respect to a mounting connection with a watthour meter socket to facilitate movement of the watthour meter, at least a portion of the handle formed as a monolithic part of the cover.

16. The watthour meter of claim 15 wherein the handle comprises a one piece member unitary with the cover.

17. The watthour meter of claim 17 wherein the handle includes at least one arm extending from the cover, a grip member connected to the at least one arm.

18. The watthour meter of claim 17 wherein:

the handle comprises two arms extending from the cover; and a cross member fixed between the two arms.

19. The watthour meter of claim 15 wherein the handle comprises:

a central leg having opposite ends, the ends fixedly joined to the cover and spacing the central leg from the cover.

20. The watthour meter of claim 19 further comprising:

fasteners removably, fixedly joining the ends of the central leg to the cover.

21. The watthour meter of claim 15 further comprising:

the cover having a sidewall extending between first and second ends;

an end wall formed at the second end of the sidewall; and the handle carried on the sidewall.

22. The watthour meter of claim 15 comprising:

the cover having a sidewall extending between first and second ends, a mounting flange formed at the first end of the sidewall, an end wall formed at the second end of the cover.

23. In a watthour meter, the improvement comprising:

a base carrying metering components;

a cover mounted on the base; and a handle molded as a one piece unit with the cover and formed primarily to facilitate movement of the watthour meter with respect to a mounting connection with a watthour meter socket to facilitate movement of the watthour meter, the handle and the cover molded as a one piece unit.

24. In a watthour meter, the improvement comprising:

a base carrying metering components;

a cover mounted on the base; and a handle carried on the cover and formed primarily to facilitate movement of the watthour meter with respect to a mounting connection with a watthour meter socket to facilitate movement of the watthour meter;

the handle including at least one arm extending from the cover; and an aperture formed in the at least one arm forming a gripping surface in the arm.

25. The watthour meter of claim 24 wherein the arm extends perpendicularly from the cover.

26. The watthour meter of claim 25 wherein the handle comprises:

two diametrically opposed arms on the cover, each arm having an aperture therein.

27. In a watthour meter, the improvement comprising:

a base carrying metering components;

a cover mounted on the base; and a handle carried on the cover and formed primarily to facilitate movement of the watthour meter with respect to a mounting connection with a watthour meter socket to facilitate movement of the watthour meter, the handle including at least one recess formed in the cover defining a finger grip surface.

28. The watthour meter of claim 27 wherein the at least one recess comprises:

two circumferentially spaced recesses formed in the cover, each defining a finger grip surface.

29. In a watthour meter, the improvement comprising:

a base carrying metering components;

a cover mounted on the base; and a handle carried on the cover and formed primarily to facilitate movement of the watthour meter with respect to a mounting connection with a watthour meter socket to facilitate movement of the watthour meter, the handle including at least one projection formed on and extending outward from the cover, the at least one projection defining a finger grip surface.

30. The watthour meter of claim 29 wherein the at least one projection comprises:
a pair of circumferentially spaced projections formed in the cover, each projection defining a finger grip surface.

31. In a watthour meter, the improvement comprising:
a base carrying metering components;
a cover mounted on the base; and
a handle carried on the cover and formed primarily to facilitate movement of the watthour meter with respect to a mounting connection with a watthour meter socket to facilitate movement of the watthour meter, the handle including:
an arm extending from the cover; and
an end flange projecting from an end of the arm and forming a finger grip surface.

32. The watthour meter of claim 31 wherein:
the arm extending from the cover is disposed along a top portion of the cover when the cover is mounted on a watthour meter and the watthour meter is mounted in its nominal mounting position in a watthour meter socket.

33. The watthour meter of claim 31 wherein the arm is a unitary, one piece part of the cover.

34. In a watthour meter, the improvement comprising:
a base carrying metering components;
a cover mounted on the base, the cover having a sidewall extending between first and second ends and an end wall formed at the second end of the sidewall; and
a handle carried on the sidewall of the cover and formed primarily to facilitate movement of the watthour meter with respect to a mounting connection with a watthour meter socket to facilitate movement of the watthour meter, the handle including at least one recess formed in the sidewall defining a finger grip surface.

35. The watthour meter of claim 34, wherein the at least one recess comprises:
two circumferentially spaced recesses formed in the sidewall, each defining a finger grip surface.

36. In a watthour meter, the improvement comprising:
a base carrying metering components:
a cover mounted on the base, the cover having a sidewall extending between first and second end, and an end wall formed at the second end of the sidewall;
a handle carried on the sidewall of the cover and formed primarily to facilitate movement of the watthour meter with respect to a mounting connection with a watthour meter socket to facilitate movement of the watthour meter, at least one projection formed on and extending outward from the sidewall, the at least one projection defining a finger grip surface.

37. The watthour meter of claim 36 wherein the at least one projection comprises:
a pair circumferentially spaced projections formed in the body, each projection defining a finger grip surface.

38. In a watthour meter having a base with metering components and a cover attachable to the base to enclose the metering components, the improvement comprising:
a handle carried on the cover to facilitate movement of the watthour meter with respect to a mounting connection with a watthour meter socket, at least a portion of the handle formed as a monolithic part of the cover.

39. The improvement of claim 38 wherein the handle includes at least one arm monolithically extending from the cover, a grip member connected to the at least one arm.

40. The improvement of claim 38 wherein the handle comprises two arms extending from the cover; and
the grip member defining a cross member fixed between the two arms.

41. The cover of claim 38 wherein the handle comprises:
at least one arm extending from the cover; and
an aperture formed in the at least one arm, the aperture forming a gripping surface.

42. The improvement of claim 41 wherein the arm extends perpendicularly from the cover.

43. The improvement of claim 38 wherein the handle comprises:
at least one projection formed on and extending outward from the cover, the at least one projection defining a finger grip surface.

44. The improvement of claim 43 wherein the at least one projection comprises:
a pair of circumferentially spaced projections formed in the cover, each projection defining a finger grip surface.

45. The improvement of claim 38 wherein the handle comprises:
a central leg having opposite ends, the ends fixedly joined to the cover and spacing the central leg from the body.

46. The improvement of claim 45 further comprising:
fasteners removably, fixedly joining the ends of the central leg to the cover.

47. The improvement of claim 38 wherein the handle comprises:
an arm extending from the cover; and
an end flange projecting from an end of the arm and forming a finger grip surface.

48. The improvement of claim 47 wherein:
the arm extending from the body is disposed along a top portion of the cover when the cover is mounted on a watthour meter and the watthour meter is mounted in its nominal mounting position in a watthour meter socket.

49. The cover improvement of claim 47 wherein the arm is a unitary, one piece part of the cover.

50. The improvement of claim 38 further comprising:
the cover having a sidewall extending between first and second ends, an end wall formed at the second end of the sidewall; and
the handle carried on the sidewall of the cover.

51. The claim 50 wherein the handle comprises:
at least one recess formed in the sidewall of the cover defining a finger grip surface.

52. The improvement of claim 51 wherein the at least one recess comprises:
two circumferentially spaced recesses formed in the sidewall of the cover, each defining a finger grip surface.

53. The improvement of claim 50 wherein the handle comprises:
at least one projection formed on and extending outward from the sidewall of the cover, the at least one projection defining a finger grip surface.

54. The cover improvement of claim 53 wherein the at least one projection comprises:
a pair of circumferentially spaced projections formed in the, each projection defining a finger grip surface.

* * * * *

UNITED STATES PATENT AND TRADEMARK OFFICE
CERTIFICATE OF CORRECTION

PATENT NO. : 6,679,723 B1
DATED : January 20, 2004
INVENTOR(S) : Darrell Robinson It is certified that error appears in the above-identified patent and that said Letters Patent is hereby corrected as shown below:

Column 9,
Line 64, delete "1" and insert -- 38 --.

Column 11,
Line 61, delete "17" and insert -- 15 --.

Column 14,
Line 65, after "the" insert -- cover --.

Signed and Sealed this

Eighth Day of June, 2004

JON W. DUDAS
*Acting Director of the United States Patent and Trademark Office*